United States Patent [19]
Deschene

[11] Patent Number: 5,465,261
[45] Date of Patent: Nov. 7, 1995

[54] RAM BASED ARCHITECTURE FOR ECC CIRCUITS

[75] Inventor: Daniel J. Deschene, Morgan Hill, Calif.

[73] Assignee: National Semiconductor Corporation, Santa Clara, Calif.

[21] Appl. No.: 100,985

[22] Filed: Aug. 3, 1993

[51] Int. Cl.⁶ .......................... H03M 13/00; G06F 11/10
[52] U.S. Cl. ........................ 371/39.1; 371/37.1
[58] Field of Search ................. 371/39.1, 37.1, 371/40.1; 364/746.1

[56] References Cited

U.S. PATENT DOCUMENTS

| | | | |
|---|---|---|---|
| 4,410,989 | 10/1983 | Berlekamp | 371/40 |
| 4,584,686 | 4/1986 | Fritze | 371/37 |
| 4,777,635 | 10/1988 | Glover | 371/40 |
| 5,280,488 | 1/1994 | Glover et al. | 371/37.1 |

Primary Examiner—Roy N. Envall, Jr.
Assistant Examiner—Emmanuel Moise
Attorney, Agent, or Firm—Steven F. Caserza; Flehr Hohbach Test Albritton & Herbert

[57] ABSTRACT

An ECC and/or ECC single burst trapping circuit is taught in which each such circuit has its state stored in the RAM and, in one embodiment, also allowing the use of a single general purpose multiplier rather than a large number of separate dedicated multipliers. Higher speed data rates available from current CMOS integrated circuit processes are utilized to share the higher speed operation of the single general purpose multiplier, while allowing the circuit to operate at sufficiently high speed to accommodate the speed of current and future disk drive technology. An M row×N column bit RAM is used to store the state of the circuit, decreasing the overall size of the integrated circuit. A single general purpose multiplier is used for the ECC generation detection circuit and a single set of a N bit wide exclusive OR gate arrays and multipliers is used for the ECC single burst trapper circuit. As the RAM is sequenced through its addresses, the single multiplier and exclusive OR gate array are used repeatedly to determine the result to be stored in the subsequent location of the RAM. A sequence made through M RAM locations, together with one additional step to load the hold register needed in the burst trapper architecture, completes the operation. In accordance with another embodiment, a plurality of parallel paths are used to speed operation of the device, each of the parallel paths having associated RAM and a general purpose multiplier.

38 Claims, 14 Drawing Sheets

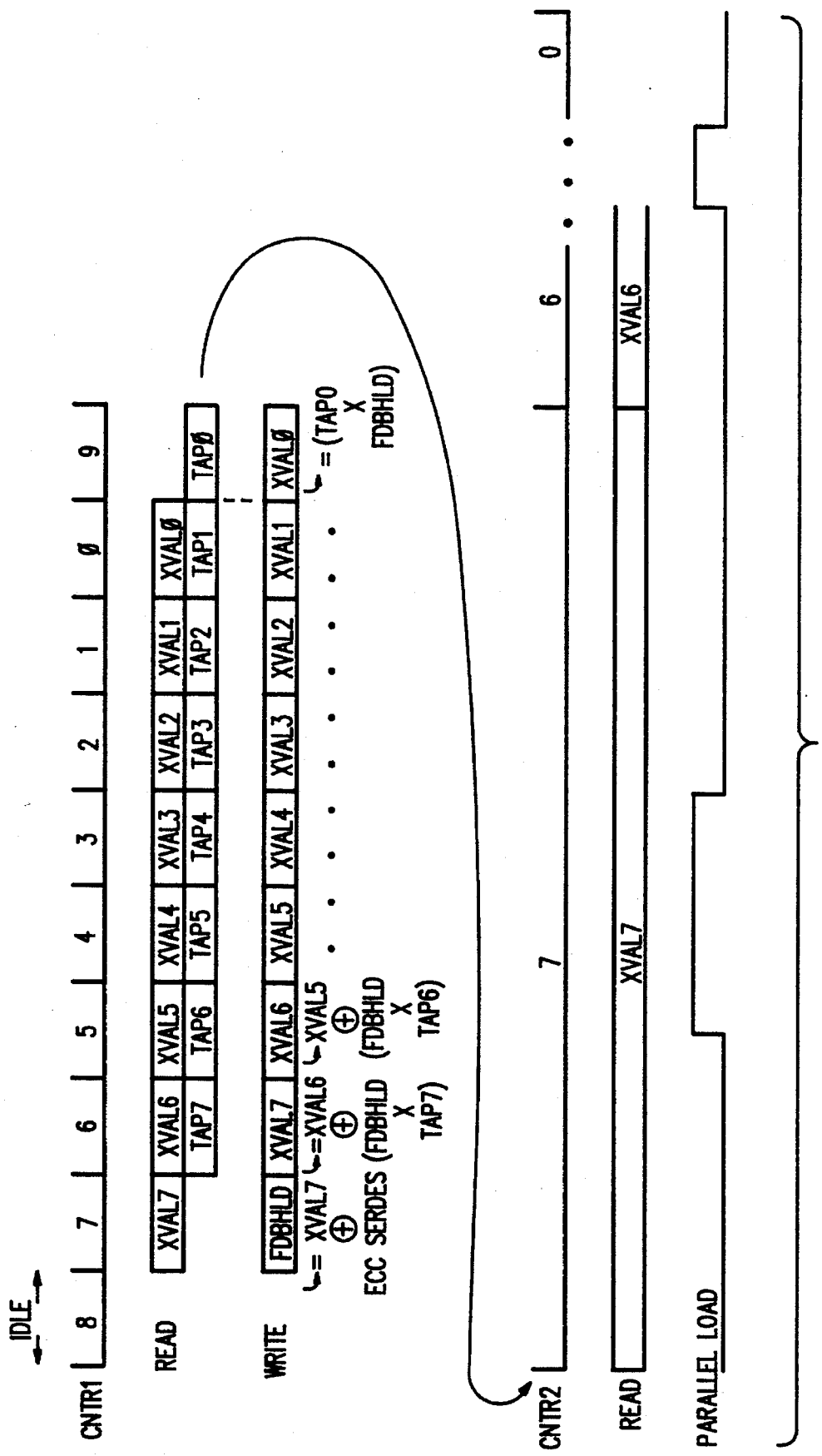

middle cell is repeated p−2 times for 3 or more parallel paths. In general, MS byte is Xval m−tm/p−1, and LS byte is Xval m−(t+1)m/p, where t is from 1 to p−2.
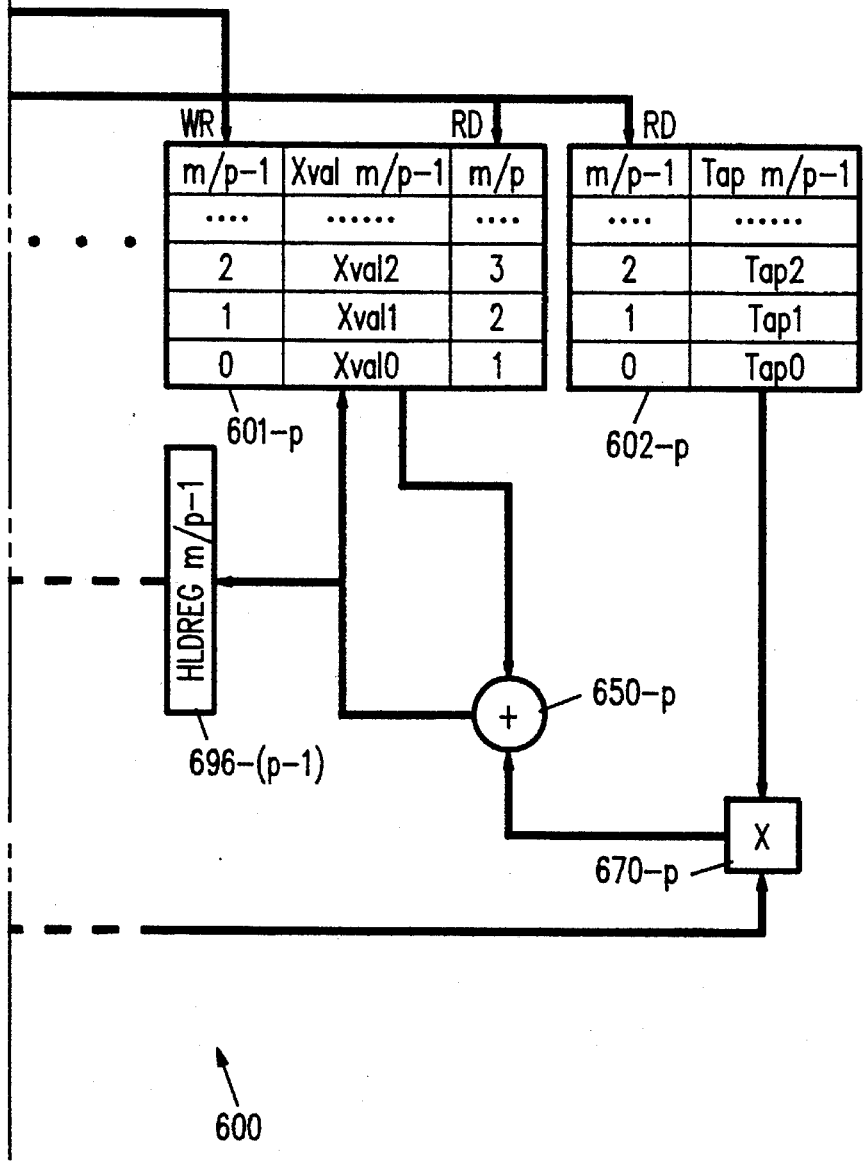
FIG. 6c
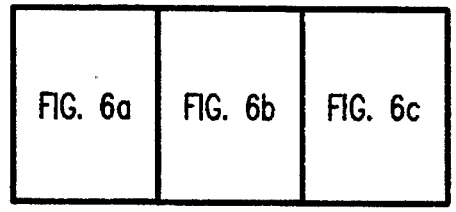
KEY TO FIG. 6 middle cell is repeated p-2 times for 3 or more parallel paths. In general, for middle cells, LS byte is Rval tm/p and MS byte is Rval (t+1)m/p-1, where t is from 1 to p-2.
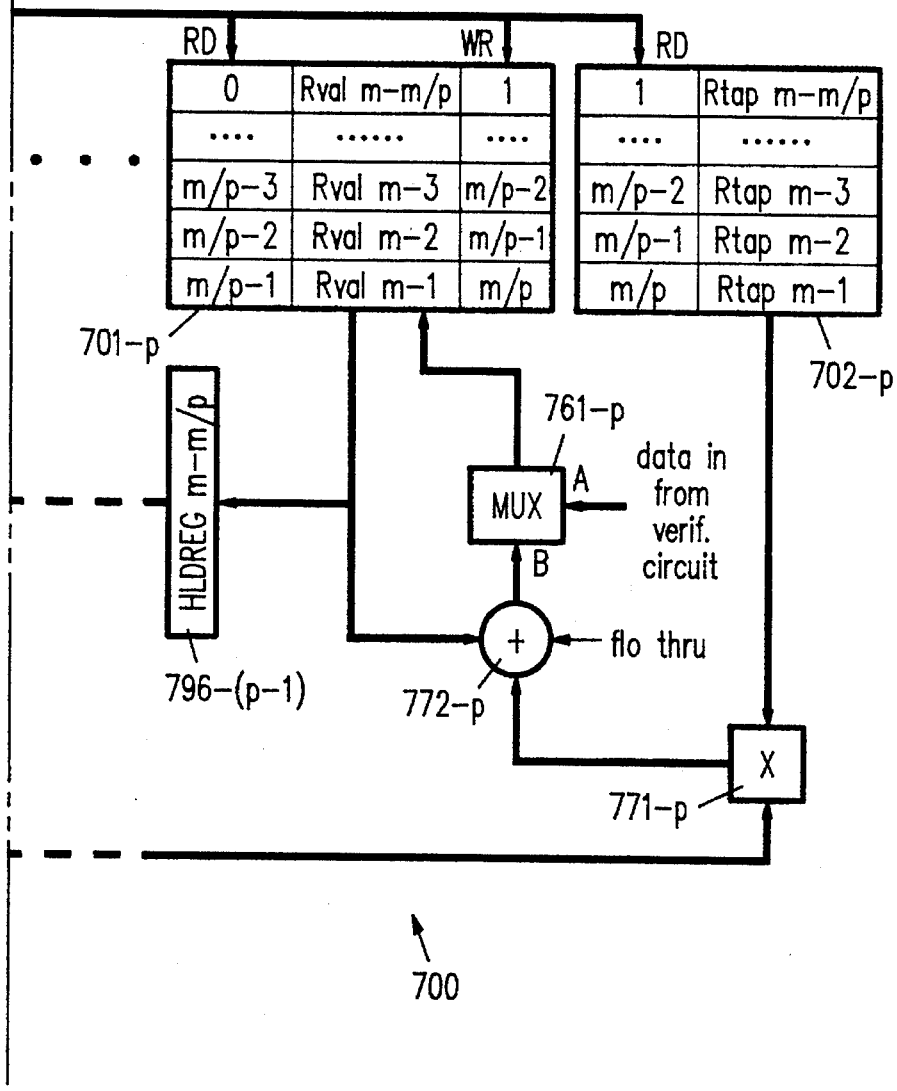
FIG. 7c
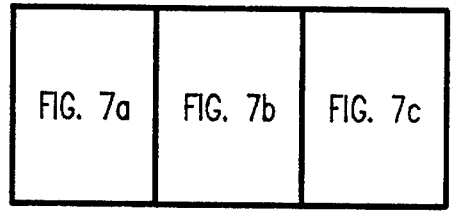
KEY TO FIG. 7

5,465,261

RAM BASED ARCHITECTURE FOR ECC CIRCUITS

BACKGROUND

This invention pertains to error correction code (ECC) circuits, and more specifically an ECC circuit utilizing the Reed-Solomon technique. In particular, this invention pertains to such a Reed-Solomon ECC circuit utilizing a RAM based architecture for increased speed, lower power, and reduced integrated circuit die area.

DESCRIPTION OF THE PRIOR ART

It is known in the art to utilize error detection and correction for a number of purposes, including to assure proper data retrieval from a magnetic media such as a spinning disk memory. FIG. 1 is a block diagram depicting a typical computer system utilizing error correction code circuitry (ECC) 13. Computer system 10 includes a disk memory 11, for example, which is written to by a serial bit stream and provides a serial bit stream when read from. The serial bit streams apply data to and from disk 11 through serializer/deserializer (SERDES) 12, for example in response to a direct memory access operation controlled by direct memory access (DMA) controller 14. DMA controller 14 operably connects the data stored within disk memory 11, solid state memory 15, and data available on or requested by system bus 16. Error correction code circuitry 13 is connected to DMA controller 14 with a parallel bus, and to serializer/deserializer 12 via bidirectional serial bus. ECC circuitry 13 serves to encode data being stored on disk 11 with an error correction code, and serves to detect errors in data read from disk 11 and correct that data after it is written to memory via DMA controller 14.

One prior art technique is to use the Reed-Solomon error correction code, which involves the generation of ECC check bits associated with a set of data bits stored on the disk. For purposes of this description, the variable M will define the number of symbols in a set of data bits, and the variable N will define the number of bits per symbol. The Reed-Solomon error correction code works to $2^N$ symbols. For example, when M=8 and N=10, a set of data bits is formed of 1024 symbols and thus 10,240 data bits, for which an associated set of M×N (and thus 80 in this example) ECC check bits are created and written to disk. Actually, in a typical prior art Reed-Solomon system of this configuration, there will be 88 ECC check bits created and written to the disk, with 80 of these check bits being Reed-Solomon error correction check bits, and the other eight check bits being available for any other desired purpose. Upon reading the disk, the set of data bits together with the associated ECC check bits are read, and the ECC check bits verified. For this verification process, the data bits read from the disk are used to create another set of ECC check bits, which is compared with the set of ECC check bits read from the disk. Any discrepancy in these two sets of ECC check bits indicates an error in the information (i.e. the data bits and the ECC check bits) read from the disk. The location and nature of the discrepancy between the two sets of ECC check bits can allow the correction of the information read from the disk. This is referred to as the burst trapping of a single burst error.

FIG. 2 is a block diagram depicting a prior art Reed-Solomon ECC architecture, with the operation being shown by the associated timing diagram of FIG. 2a. As shown in FIG. 2, ECC circuit 100 includes a plurality of eight shift registers 103-0 through 103-7, each having a parallel bit width of ten. The 80 bits stored in shift registers 103-0 through 103-7 store the state of circuit 100 and are typically implemented by utilizing 80 D-type master/slave flip flops, ten such flip flops for each of the eight shift registers 103-0 through 103-7. Also shown in FIG. 2 is the use of a plurality of ten dedicated multipliers 101-0 through 101-7, each receiving an input tap weight tap0 through tap7 on busses 102-0 through 102-7, respectively, in this example each of ten bit width. Multipliers 101-0 through 101-7 also receive on bus 105 feedback data, in this example also of ten bit width. Typically, multipliers 101-0 through 101-7 are each formed of a 10 by 10 finite field multiplier, when the tap weight signal and feedback signal are each of ten bits in width. The tap signals tap0 through tap7 provided to multipliers 101-0 through 101-7 via busses 102-0 through 102-7, respectively, are provided by hard wiring logical ones and logical zeros to appropriate ones of the leads in the tap busses. Also shown in FIG. 2 is the use of ten bit exclusive OR arrays 104-0 through 104-7 for providing, via an exclusive OR operation of the output of a preceding multiplier and shift register, a ten bit input word to a succeeding shift register.

In operation, input data (e.g. from a host system wishing to write data to a disk storage device) is received via serial data input port 106 and applied to ECC serializer/deserializer 107, which will provide its serial output stream on serial data output lead 108, including the addition of ECC check bits at the end of a set of data bits.

In this prior art example, where the width of each shift register 103-0 through 103-7 is ten bits, a series of ten serial bits are shifted into ECC serializer/deserializer 107, at which time the ten bits are provided in parallel to exclusive OR gate array 104-7 via bus 110 for an exclusive OR operation with the output of shift register 103-7. The result provided by exclusive OR gate array 104-7 is applied via bus 105 to multipliers 101-0 through 101-7 for multiplication with tap weights tap0 through tap7 provided to multipliers 101-0 through 101-7 via busses 102-0 through 102-7. The output values of each of these multipliers 101-0 through 101-7 is provided to the subsequent shift register. Of course, the least significant stage shift register 103-0 has no previous stage, so the output signal from multiplier 101-0 is equal to the tap0 weight times the value provided on bus 105 from exclusive OR gate array 104-7.

Each of the shift register stages 103-0 through 103-7 are updated on the same clock cycle, each such cycle corresponding to ten bit shifts into the ECC deserializer 107. Therefore, the ECC generation operation of the prior art circuit 100 occurs at 1/10 the bit rate, with the result of the ECC operation being eight 10 bit words available from shift registers 103-0 through 103-7 at the conclusion of the set of data bits on serial data input lead 106. At this time, these 80 ECC bits are made available to ECC serializer/deserializer 107 by sequential parallel loads as these ECC bits are flushed out of shift registers 103-0 through 103-7 by a series of clock signals.

As the speed of magnetic media increases, it is important that the speed of electronic circuitry operating to control data being written to and read from the disk keep pace with the increasing speed of the disk drive technology. However, the prior art Reed-Solomon ECC circuit 100 of FIG. 2, runs at 1/10 bit rate, which is substantially below the operating speed capable of integrated circuits fabricated utilizing current submicron CMOS fabrication processes.

FIG. 3 is a block diagram of a prior art burst trapper circuit 200, with the operation of prior art burst trapper circuit 200 shown by the timing diagram of FIG. 3a. Circuit 200 is of similar architecture as ECC generation and detection circuit 100 of FIG. 2, and thus similar reference numerals have been used, as appropriate. As noted by the arrows, the data flow between exclusive OR gate arrays 104-0 through 104-7 and shift registers 103-0 through 103-7 is reversed from that of the circuit shown in FIG. 1, with the initial set of data loaded into burst trapper circuit 200 from ECC generation and detection circuit 100 of FIG. 2 when it is determined by ECC generation and detection circuit 100 that an error has been detected. In operation, the value of the least significant shift register 103-0 is provided to bus 105 for simultaneous multiplication by multipliers 101-0 through 101-7 with respective tap weights Rtap0 through Rtap7 made available on tap busses 102-0 through 102-7, respectively. The output word from each multiplier 101-0 through 101-7 is applied to exclusive OR arrays 104-0 through 104-7 for an exclusive OR operation with the value provided by the previous shift register stage. Since shift register 103-7 has no previous shift register stage, the result of the multiplication performed by multiplier 101-7 on the value provided on bus 105 by shift register 103-0 and the value of Rtap7 is applied directly to shift register 103-7.

Since the operation performed by burst trapper circuit 200 of FIG. 3 does not involve the real time acquisition of disk data during its operation, the shift registers of circuit 200 can operate faster than the shift registers of ECC generation and detection circuit 100 of FIG. 2. In practice, circuit 200 is operated at a speed of about twice the speed of operation of ECC generation and detection circuit 100 of FIG. 2, since the burst trapping operation provided by circuit 200 of FIG. 3 needs to be performed only once per sector read from the disk memory. Therefore, at this speed of operation, circuit 200 completes its burst trapping operation in half the time it requires circuit 100 of FIG. 2 to process sector information. This allows the remaining one half of this sector time for the performance of a direct memory access (DMA) operation to correct the error detected by the burst trapping circuit 200, which error is corrected in a semiconductor buffer memory. However, it is to be understood that the single burst trapper 200 is implemented as a separate circuit than ECC generation and detection circuit 100, so that both of these circuits can be operated simultaneously during reading data from a disk drive.

SUMMARY

In accordance with the teachings of this invention, the integrated circuit die area necessary to implement the ECC and/or ECC single burst trapping function is greatly reduced, by utilizing a random access memory (RAM) in each of the ECC generation and detection and the ECC single burst error trapper circuits, allowing each such circuit to have its state stored in the RAM and, in one embodiment, also allowing the use of a single general purpose multiplier rather than a large number of separate dedicated multipliers. In accordance with the teachings of this invention, higher speed data rates available from current CMOS integrated circuit processes are utilized to share the higher speed operation of the single general purpose multiplier, while allowing the circuit to operate at sufficiently high speed to accommodate the speed of current and future disk drive technology.

In accordance with the teachings of this invention, an M row×N column bit static RAM is used to store the state of the circuit, decreasing the overall size of the integrated circuit as a RAM cell is substantially smaller than the area required to form a single bit flip flop. A single general purpose multiplier is used for the ECC generation detection circuit and a single set of a N bit wide exclusive OR gate array and multipliers is used for the ECC single burst trapper circuit. As the RAM is sequenced through its addresses, the single multiplier and exclusive OR gate array are used repeatedly to determine the result to be stored in the subsequent location of the RAM. A complete sequence made through M RAM locations, together with one additional step to load the hold register needed in the burst trapper architecture, completes the operation, similar to one shift of the prior art shift register implementation.

In accordance with another embodiment of this invention, a plurality of parallel paths are used to speed operation of the device, each of the parallel paths having associated RAM and a general purpose multiplier.

BRIEF DESCRIPTION OF THE DRAWINGS

FIG. 4a is a timing diagram depicting the operation of the embodiment of FIG. 4;

DETAILED DESCRIPTION

Figure 4:
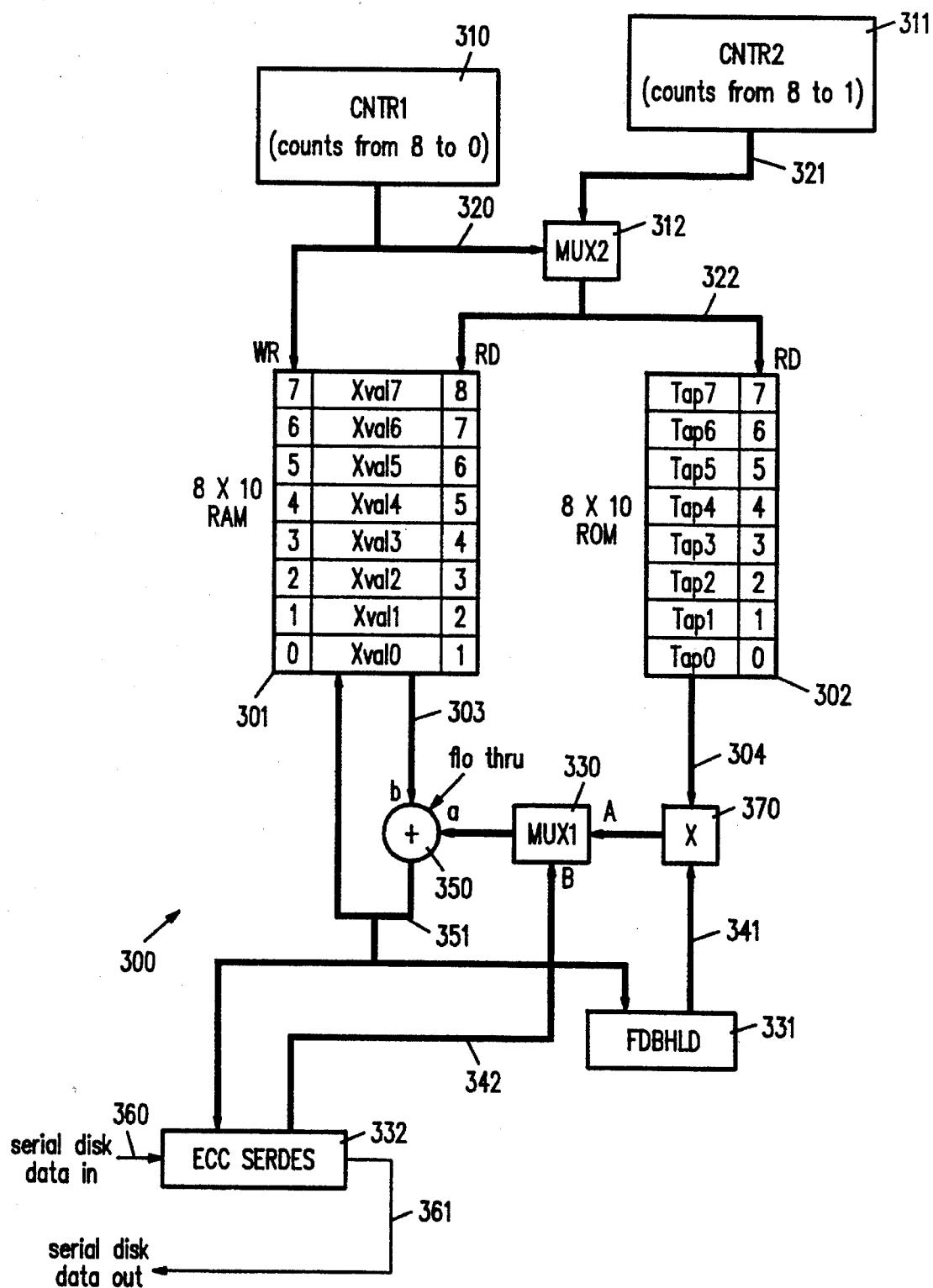
FIG. 4 is a block diagram of one embodiment of an ECC generation and detection circuit constructed in accordance with the teachings of this invention.

FIG. 4 is a block diagram of one embodiment of an ECC generation and detection circuit 300 constructed in accordance with the teachings of this invention, with Table 1 and the timing diagram of FIG. 4a showing its operation. In this exemplary embodiment, circuit 300 employs a Reed-Solomon technique, and is used in conjunction with disk storage of data.

TABLE 1

| CNTRL | READ | WRITE |
|---|---|---|
| 8 | Xval7 | FDBHLD = Xval7 xor ECC SERDES |
| 7 | Xval6, Tap7 | Xval7 = Xval6 xor FDBHLD × Tap7 |
| 6 | Xval5, Tap6 | Xval6 = Xval5 xor FDBHLD × Tap6 |
| 5 | Xval4, Tap5 | Xval5 = Xval4 xor FDBHLD × Tap5 |
| 4 | Xval3, Tap4 | Xval4 = Xval3 xor FDBHLD × Tap4 |
| 3 | Xfal2, Tap3 | Xval3 = Xval2 xor FDBHLD × Tap3 |
| 2 | Xval1, Tap2 | Xval2 = Xval1 xor FDBHLD × Tap2 |

TABLE 1-continued

| CNTRL | READ | WRITE |
|---|---|---|
| 1 | Xval0, Tap1 | Xval1 = Xval0 xor FDBHLD × Tap1 |
| 0 | Tap0 | Xval0 = FDBHLD × Tap0 |

Circuit 300 includes random access memory (RAM) 301 having a plurality of M storage locations, each of N bit width. In one embodiment, M equals 8 and N equals 10, allowing for $2^N$ symbols or 10240 bits in the set of bits which might, for example, correspond to the number of bits in a disk sector. In this example, the maximum single burst error which is guaranteed correctable is equal to N (M/2−1) +1 or 31. Circuit 300 also includes memory 302, which may be formed as a read only memory (ROM) permanently storing a plurality of tap weights, one such tap weight associated with a corresponding one of the M storage locations within RAM 301. A single multiplier 370 is used, as is a single exclusive OR gate array 350 of width N. ECC serializer/deserializer 332 receives serial disk data input via serial data input lead 360 and provides serial disk output via serial output lead 361, much as has been described in conjunction with the prior art circuit of FIG. 2. Feedback hold register 331 receives data via bus 351 and stores an output word of width N from exclusive OR gate array 350.

In operation, feedback hold register 331 is loaded by reading the most significant location in RAM 301 to provide on bus 303 a word which is exclusive ORed by exclusive OR gate array 350 with the input word provided by ECC serializer/deserializer 332, as selected by multiplexor 330. The next most significant location in RAM 301 is read, as is the most significant tap weight value from ROM 302. This tap weight is multiplied by multiplier 370 with the value provided on bus 341 from feedback hold register 331. The result of the multiplication operation is provided to multiplexor 330 which selects it and provides it to exclusive OR gate array 350 for exclusive ORing with the selected data from RAM 301. The result of this exclusive OR operation is then written back to the most significant address location in RAM 301.

Figure 2:
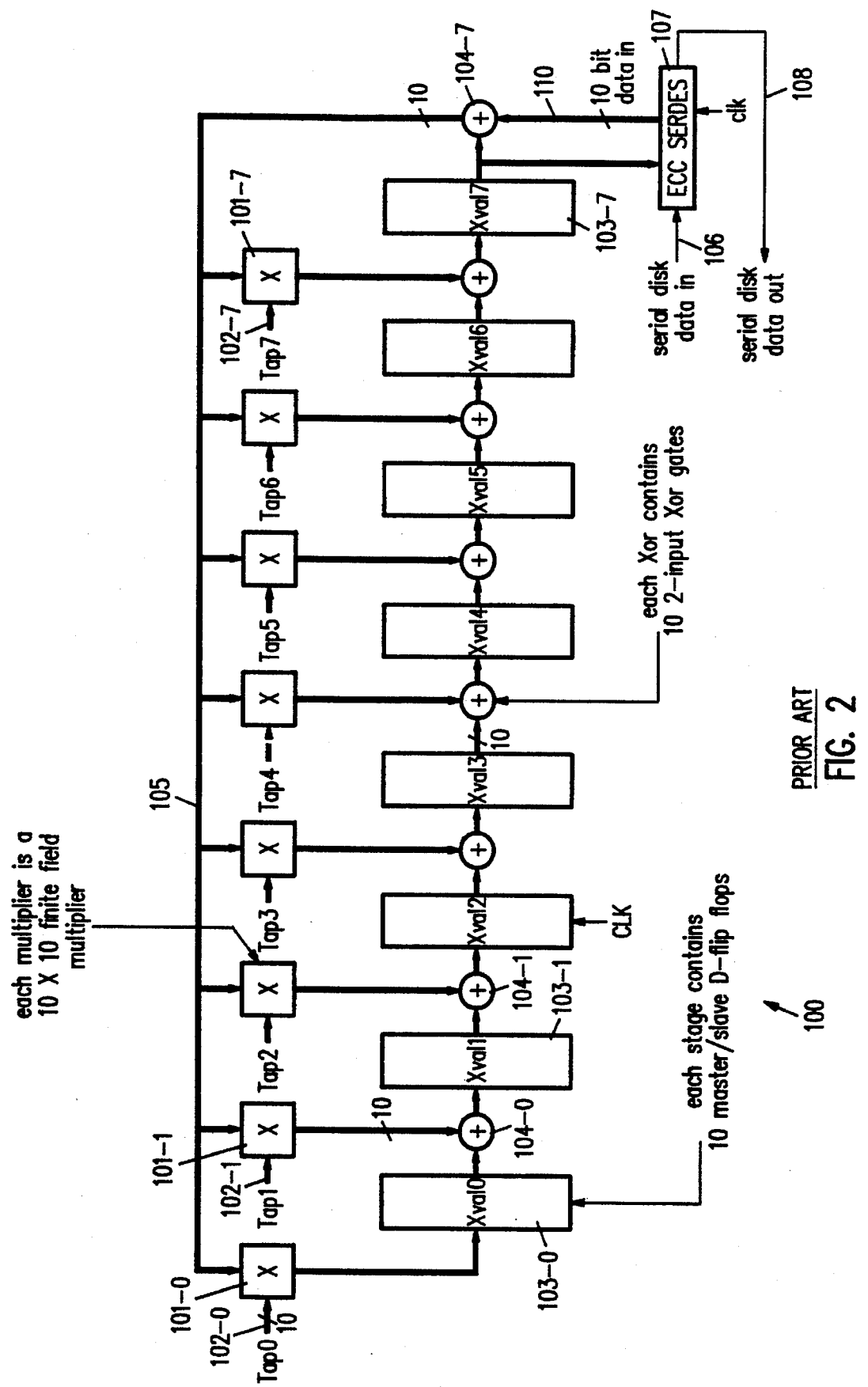
FIG. 2 is a diagram depicting a typical prior art ECC generation and detection circuit.
Figure 2A:
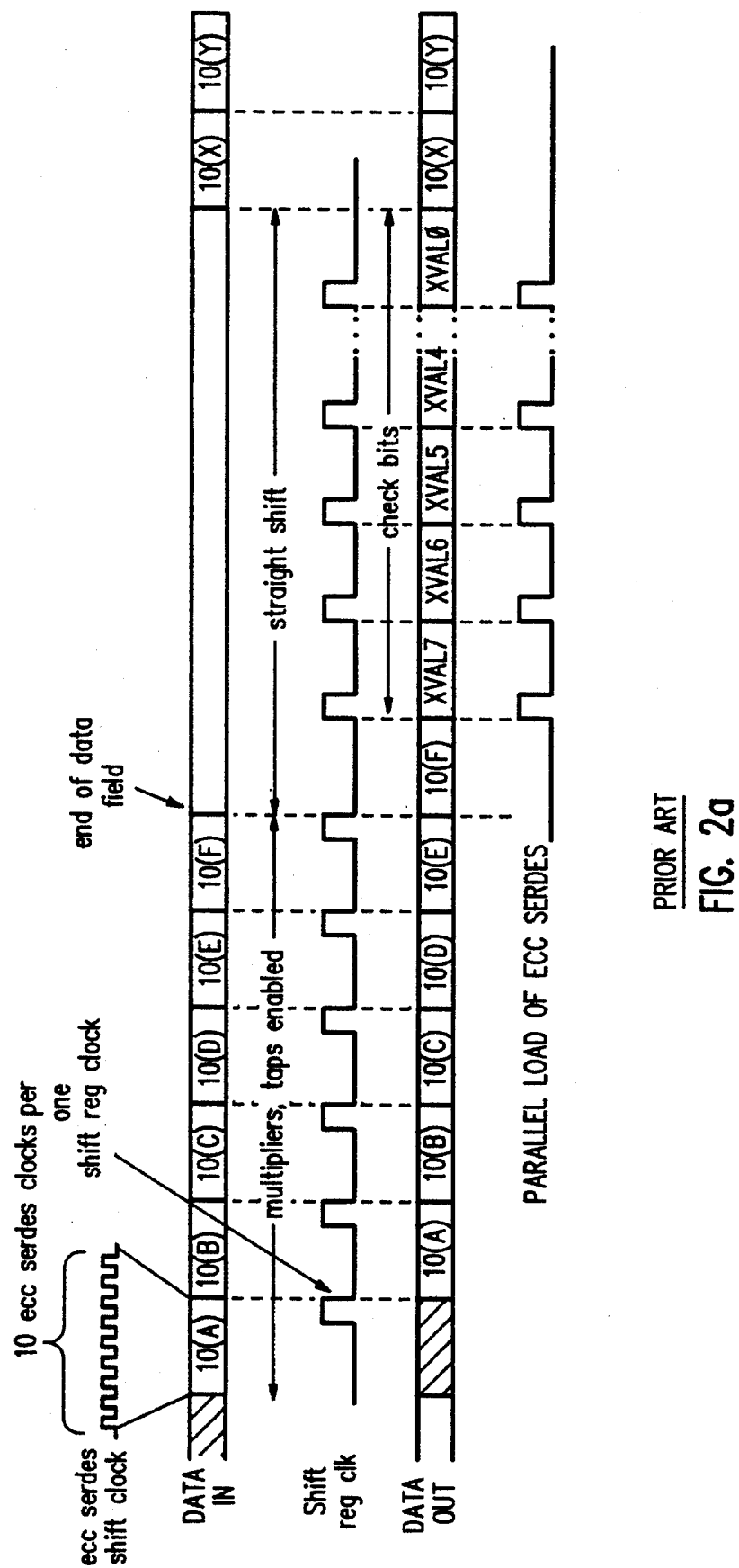
FIG. 2a is a timing diagram depicting the operation of the circuit of FIG. 2.
Figure 3:
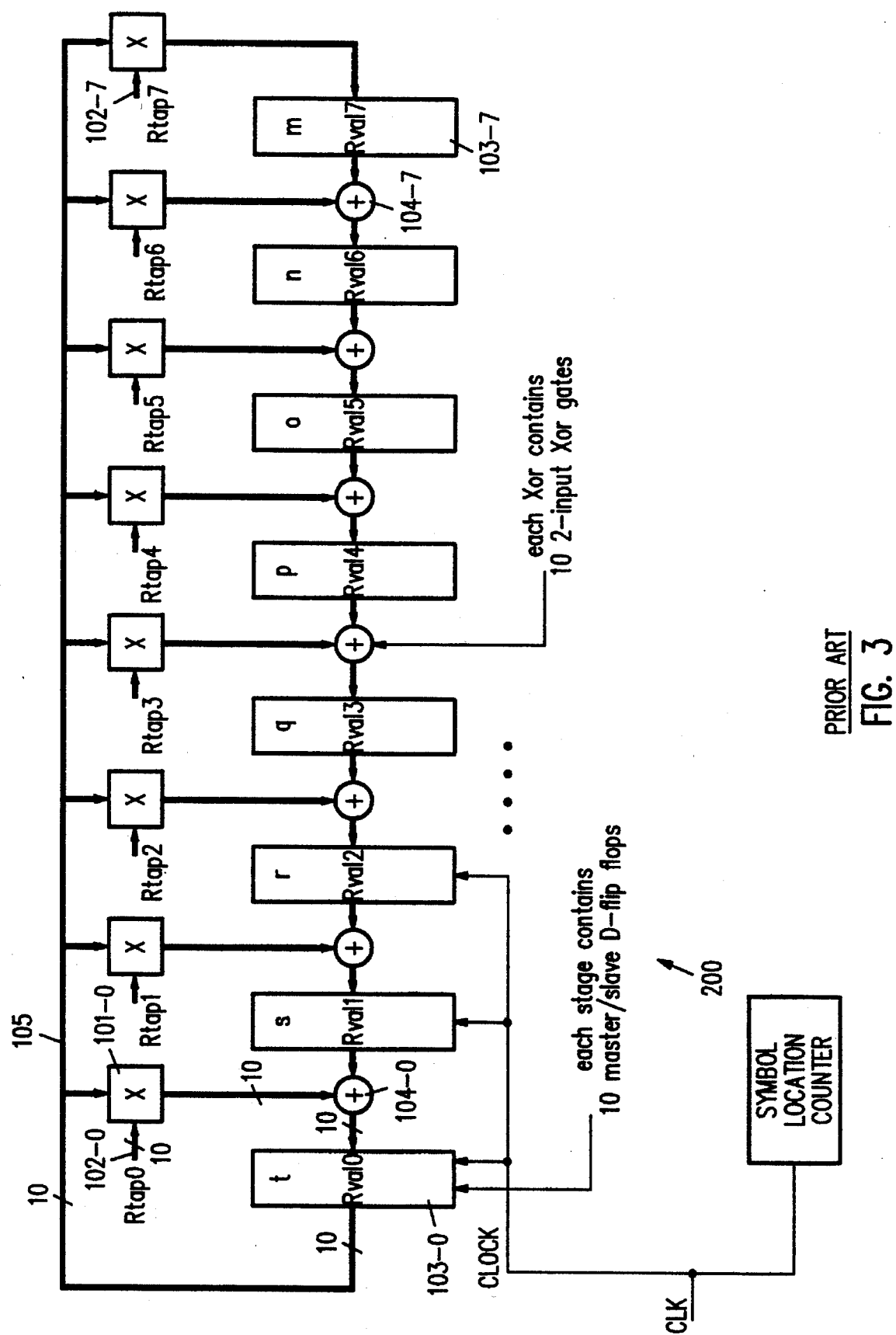
FIG. 3 is a diagram depicting a prior art ECC single burst error trapper.
Figure 3A:
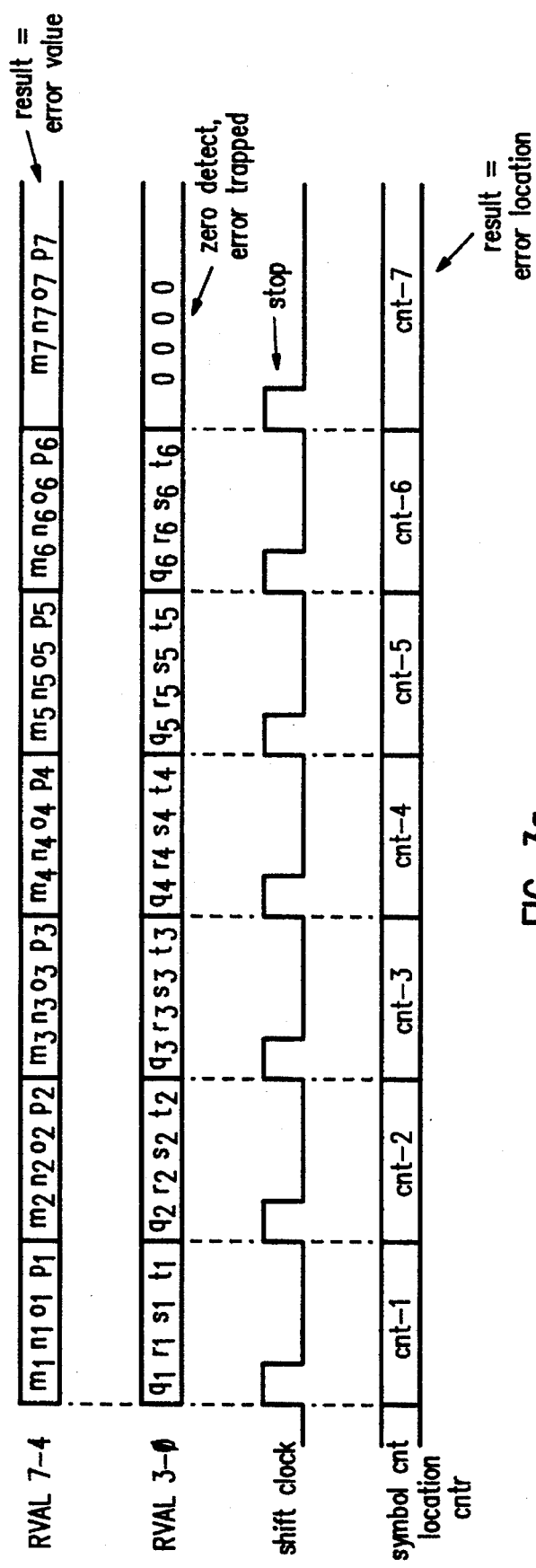
FIG. 3a is a timing diagram depicting the operation of the circuit of FIG. 3.

This operation repeats M times, thereby accomplishing the equivalent of a single operation (i.e the operation on a complete set of I bits, for example corresponding to the number of bits in a single sector on a disk drive) of the prior art ECC generation and detection circuit 100 of FIG. 2, without the need for a large number of shift registers, multipliers, or exclusive OR gate arrays.

To write the least significant value Xval0 during the last operation of the sequence, the output of multiplier 330 is written directly to the location of RAM 301 which stores Xval0 by forcing the word applied via bus 303 to exclusive OR gate array 350 to all zeros, causing exclusive OR gate array 350 to simply pass the data from multiplexor 330 to RAM 301 unchanged.

When all I bits of serial data have been shifted through serializer/deserializer 332 during a disk write operation, the data from RAM 301 is read and applied to exclusive OR gate array 350 (with the input provided from multiplexor 330 forced all low) and in this manner parallel loaded into ECC serializer/deserializer 332 for serial output on serial data output lead 361 to the disk. Conversely, when a sector has been read from the disk, the contents of the RAM are checked to determine if all Xval values contain all zeros, indicating that no error has been detected. This zero detect operation can be performed after all Xvals have been written to RAM 301, or as each final Xval is written to RAM 301.

A first counter 310 is used to control the sequencing of the accessing of locations in RAM 301 and ROM 302. An update sequence starts at a count of M and decrements through 0 and back to a count of M for the next decrementation, waiting if necessary for completion of the next load of serializer/deserializer 332. A second counter 311 serves to control the operation of the readout of values stored at locations of RAM 301, with multiplexor 310 selecting either counter 311 or counter 310 for controlling RAM 301.

During a disk read operation, if the zero detect result is true, it is determined that there is no error in the data read from disk. However, if the zero detect is false, this indicates that the data read from disk includes an error and the resultant Xvals from RAM are downloaded to a burst trapping circuit for determining the location and pattern of a single burst error.

Figure 5:
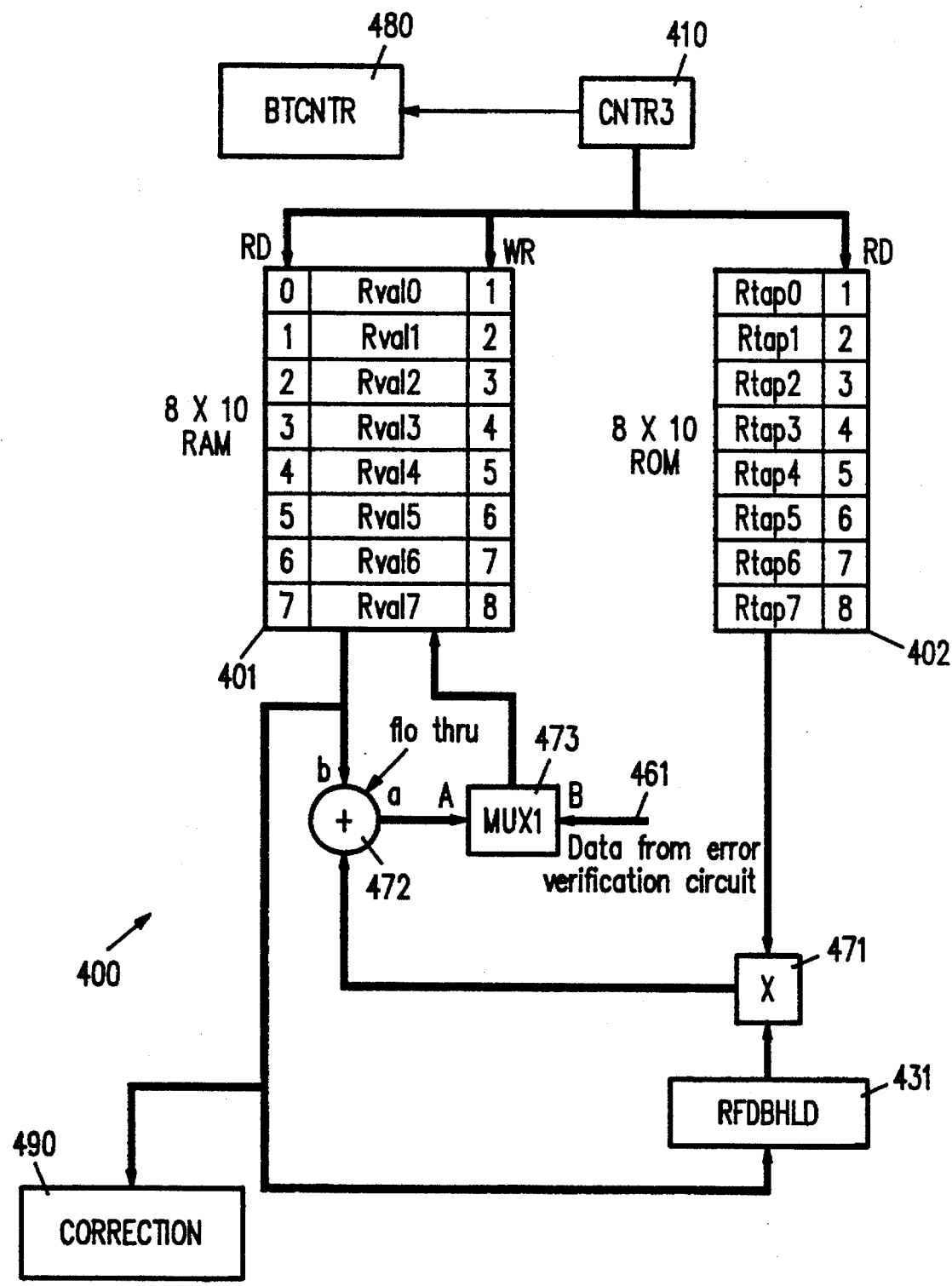
FIG. 5 is a block diagram depicting one embodiment of an ECC single burst error trapper constructed in accordance with the teachings of this invention.

FIG. 5 is a block diagram of one embodiment of a Reed-Solomon ECC single burst error trapper 400 constructed in accordance with the teachings of this invention, with Table 2 depicting its operation.

TABLE 2

| Cntr3 | Read | Write |
|---|---|---|
| 0 | Rval0 | RFBHLD = Rval0 |
| 1 | Rval1, Rtap0 | Rval0 = Rval1 xor RFBHLD × Rtap0 |
| 2 | Rval2, Rtap1 | Rval1 = Rval2 xor RFBHLD × Rtap1 |
| 3 | Rval3, Rtap2 | Rval2 = Rval3 xor RFBHLD × Rtap2 |
| 4 | Rval4, Rtap3 | Rval3 = Rval4 xor RFBHLD × Rtap3 |
| 5 | Rval5, Rtap4 | Rval4 = Rval5 xor RFBHLD × Rtap4 |
| 6 | Rval6, Rtap5 | Rval5 = Rval6 xor RFBHLD × Rtap5 |
| 7 | Rval7, Rtap6 | Rval6 = Rval7 xor RFBHLD × Rtap6 |
| 8 | Rtap7 | Rval7 = RFBHLD × Rtap7 |

The embodiment of FIG. 5 is formed of random access memory (RAM) 401, multiplier 471, and exclusive OR gate array 472. RAM 401 stores a set of values Rval0 through Rval7. In the embodiment where the number of values stored in RAM is 8, RAM 401 stores Rval0 through Rval7. Multiplexor 473 serves to select the appropriate value from either the general evaluation circuit for download of the syndrome to burst trapper 461, or multiplier 471 (during burst trapping) for application to RAM 401. Tap weight values are stored in memory 402.

In operation, a M×N bit syndrome word is output from an ECC generation and detection circuit, such as that shown in FIG. 4, via bus 461 to multiplexor 473. When this syndrome word is received, multiplexor 473 selects the syndrome for application to RAM 401, where it is stored.

To initiate operation of this embodiment of ECC single burst trapping circuit 400, the least significant value stored in RAM 401 (in this embodiment Rval0) is accessed and stored in register 431. The next most significant value is read from RAM 401 (in this embodiment Rval1) and tap value Rtap0 is read from memory 402. This tap value is applied to multiplier 471, which multiplies this tap value by the value stored in register 431. The result of this multiplication operation is provided to exclusive OR gate array 472, for exclusive ORing with currently read value Rval1 from RAM 401. The result of this exclusive OR operation is provided via multiplexor 473 to RAM 401, for storage in the location associated with Rval0, thereby updating this value. This operation continues, including the final value Rval7 being written back to RAM 401. Rval7 is written by forcing exclusive OR gate array 472 to allow the output of multiplier 471 to flow through with the result of multiplying Rtap7 by the value stored in register 431.

The control of the sequencing of the operation of circuit 400 is achieved by utilizing CNTR3 counter 410 which counts from zero to M, which in this embodiment means counter 410 counts from zero to eight. Burst trapping stops when zeros are detected sequentially in locations 4 through 7 of RAM 401. At this time, RAM 401 locations 0–3 contain the error values needed to correct the data read from disk. Symbol location counter 480 increments its count once every cycle of burst trapping circuit 400, (i.e. once for every complete set of counts of counter 410), and at this time the result stored in symbol location counter 480 specifies the location in the data of the error to be corrected.

Figure 6A:
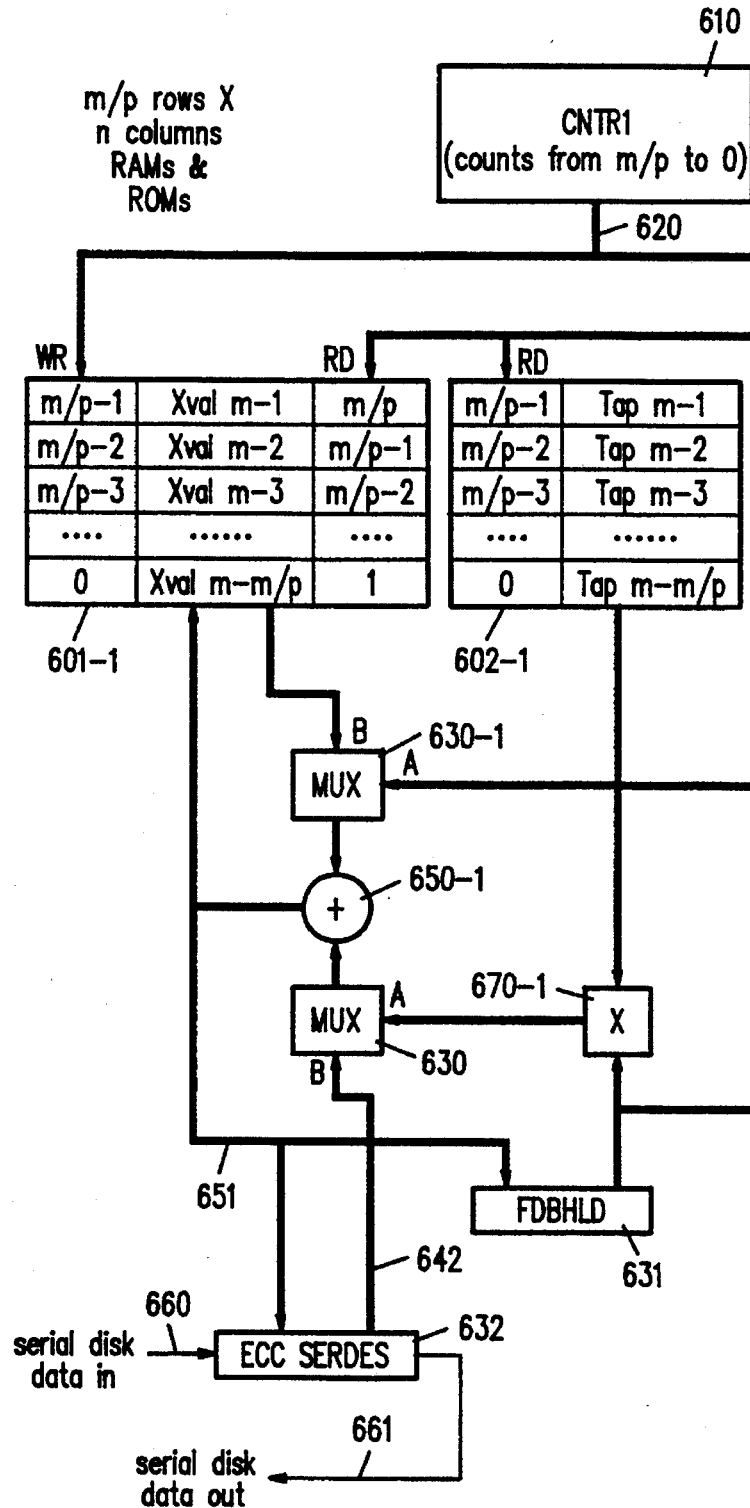
FIG. 6 is a block diagram depicting one embodiment of a parallel path ECC generation and detection circuit constructed in accordance with the teachings of this invention.
Figure 6B:
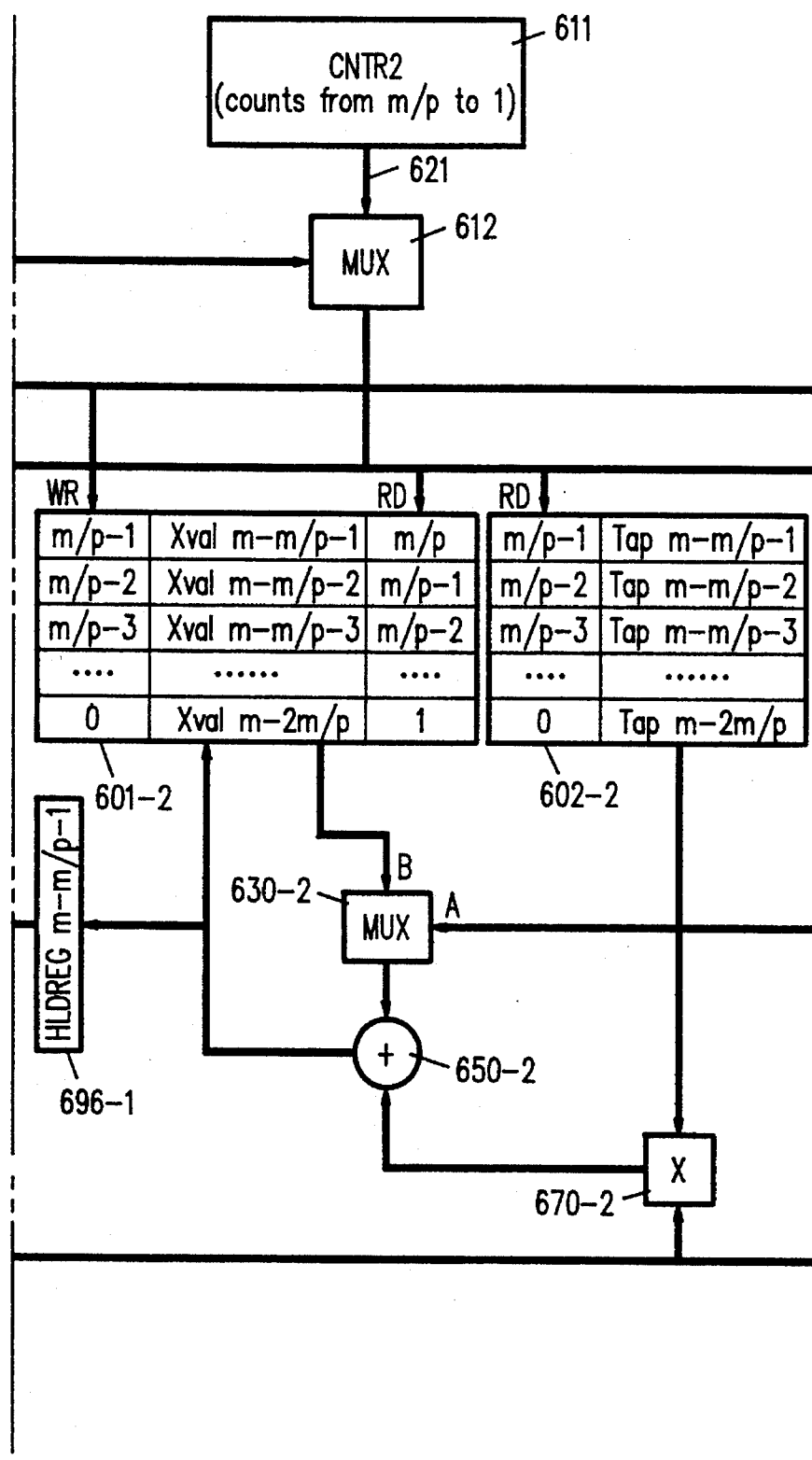

FIG. 6 is a diagram of one embodiment of a Reed-Solomon ECC generation and detection circuit 600 constructed in accordance with the teachings of this invention which utilizes a plurality of P parallel paths. The operation of the embodiment of FIG. 6, for an example where P=3 and M=12, is shown in Table 3.

TABLE 3

| Cntr 1 | Read | Write |
|---|---|---|
| 4 | Xval11 | FDBHLD = Xval11 xor ECC SERDES |
|   | Xval7 | HLDREG7 = Xval7 |
|   | Xval3 | HLDREG3 = Xval3 |
| 3 | Xval10, Tap11 | Xval11 = Xval10 xor FDBHLD × Tap11 |
|   | Xval6, Tap7 | Xval7 = Xval6 xor FDBHLD = Tap7 |
|   | Xval2, Tap3 | Xval3 = Xval2 xor FDBHLD = Tap3 |
| 2 | Xval9, Tap10 | Xval10 = Xval9 xor FDBHLD = Tap10 |
|   | Xval5, Tap6 | Xval6 = Xval5 xor FDBHLD = Tap6 |
|   | Xval1, Tap2 | Xval2 = Xval1 xor FDBHLD = Tap2 |
| 1 | Xval8, Tap9 | Xval9 = Xval8 xor FDBHLD = Tap9 |
|   | Xval4, Tap5 | Xval5 = Xval4 xor FDBHLD = Tap5 |
|   | Xval0, Tap1 | Xval1 = Xval0 xor FDBHLD = Tap1 |
| 0 | HLDREG7, Tap8 | Xval8 = HLDREG7 xor FDBHLD = Tap8 |
|   | HLDREG3, Tap4 | Xval4 = HLDREG3 xor FDBHLD = Tap4 |
|   | Tap0 | Xval0 = FDBHLD = Tap0 |

Circuit 600 includes a plurality of random access memories 601-1 through 601-P, where there are P parallel processing paths. In this embodiment in which each parallel path is of the same depth, each memory 601-1 through 601-P includes a plurality of M/P storage locations, each of N bit width. In an alternative embodiment, not shown, the depth of each parallel path need not be equal.

As shown in FIG. 6, a plurality of multipliers 670-1 through 670-P are used, one associated with each of the P parallel paths. Circuit 600 also includes a plurality of memory 602-1 through 602-P, each associated with one of the P parallel paths. In one embodiment, each memory 602-1 through 602-P is formed as a read only memory (ROM) storing a plurality of tap weights, one such tap weight associated with a corresponding one of the storage locations within their corresponding memories 601-1 through 601-P, respectively. A plurality of multipliers 670-1 through 670-P and exclusive OR gate arrays 650-1 through 650-P are used, each associated with a corresponding one of P parallel paths. ECC serializer/deserializer 362 receives serial disk data input via serial data input lead 660 provides serial disk data output via serial output leads 661, much as has been described in conjunction with the previous embodiment of FIG. 4. Feedback hold register 631 receives data from bus 651 and stores an output word of width N from exclusive OR gate array 650-1.

In operation, feedback hold register 631 is loaded by reading the most significant location in RAM 601-1 to provide a word which is exclusive Ored by exclusive OR gate array 650-1 with the input word provided by ECC serializer/deserializer 632, as selected by multiplexor 630. Concurrently, HLDREGs 696-1 through 696-(P-1) are loaded with the most significant Xvals from their respective RAMS 601-2 through 601-P. At the next count, the next most significant location in RAM 601-1 is read, as is the most significant tap weight value from ROM 602-1. This tap weight is multiplied by multiplier 670-1 with the value provided from feedback hold register 631. The result of the multiplication operation is provided to multiplexor 630 which selects it and provides it to exclusive OR gate array 650-1 for exclusive Oring with the selected data from RAM 601-1. The result of this exclusive OR operation is then written back to the most significant address location in RAM 601-1.

This operation is repeated concurrently with respect to the other ones of the P parallel processing paths, sharing feedback hold register 631 in those parallel processing paths.

This operation repeats a plurality of times, equal to M/P. To write the least significant value of each memory 601-1 through 601-(P-1) during the last operation of the sequence, hold registers 696 through 696-(P-1) are used. The value stored in these hold registers 696-1 through 696-(P-1) are selected by multiplexors 630-1 through 630-(P-1) of the preceding processing path and Xored with the result of the multiplication of the least significant tap weight from each ROM 602-1 through 602-(P-1) of FDBHLD register 631. The Xor result is written to the least significant RAM locations in RAMS 601-1 through 601-(P-1). To write the least significant value of RAM 601-P, the result of multiplication of the least significant tap weight of ROM 602-P and FDBHLD register 631 flows directly through Xor gate 650-P into the least significant location of RAM 601-P.

In this fashion, the embodiment of FIG. 6 utilizes a plurality of P parallel processing paths in order to speed the operation, while still requiring a significantly reduced number of components as compared with the prior art circuit exemplified by FIG. 2.

Figure 7A:
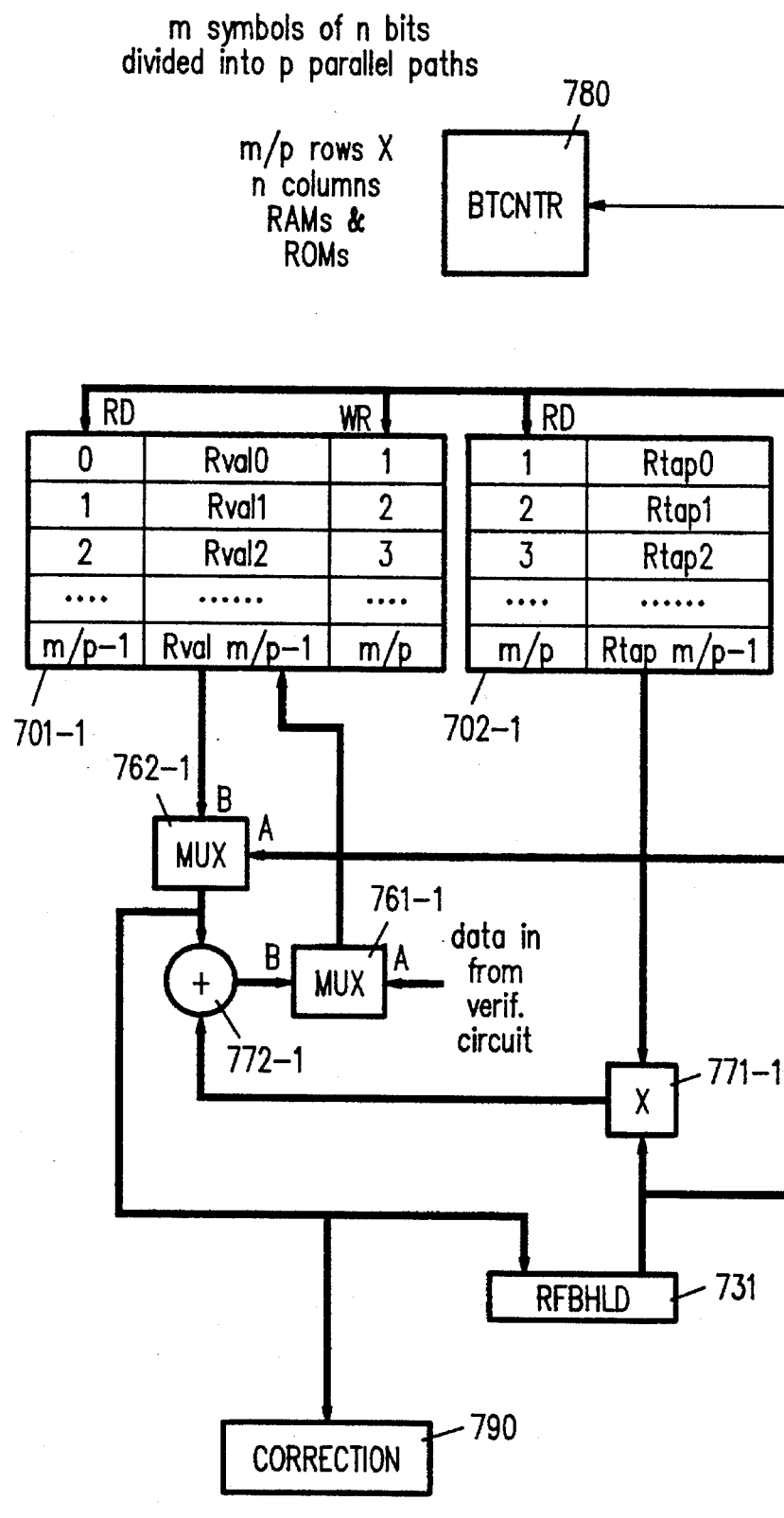
FIG. 7 is a block diagram depicting one embodiment of a parallel path single burst error trapper circuit constructed in accordance with the teachings of this invention.
Figure 7B:
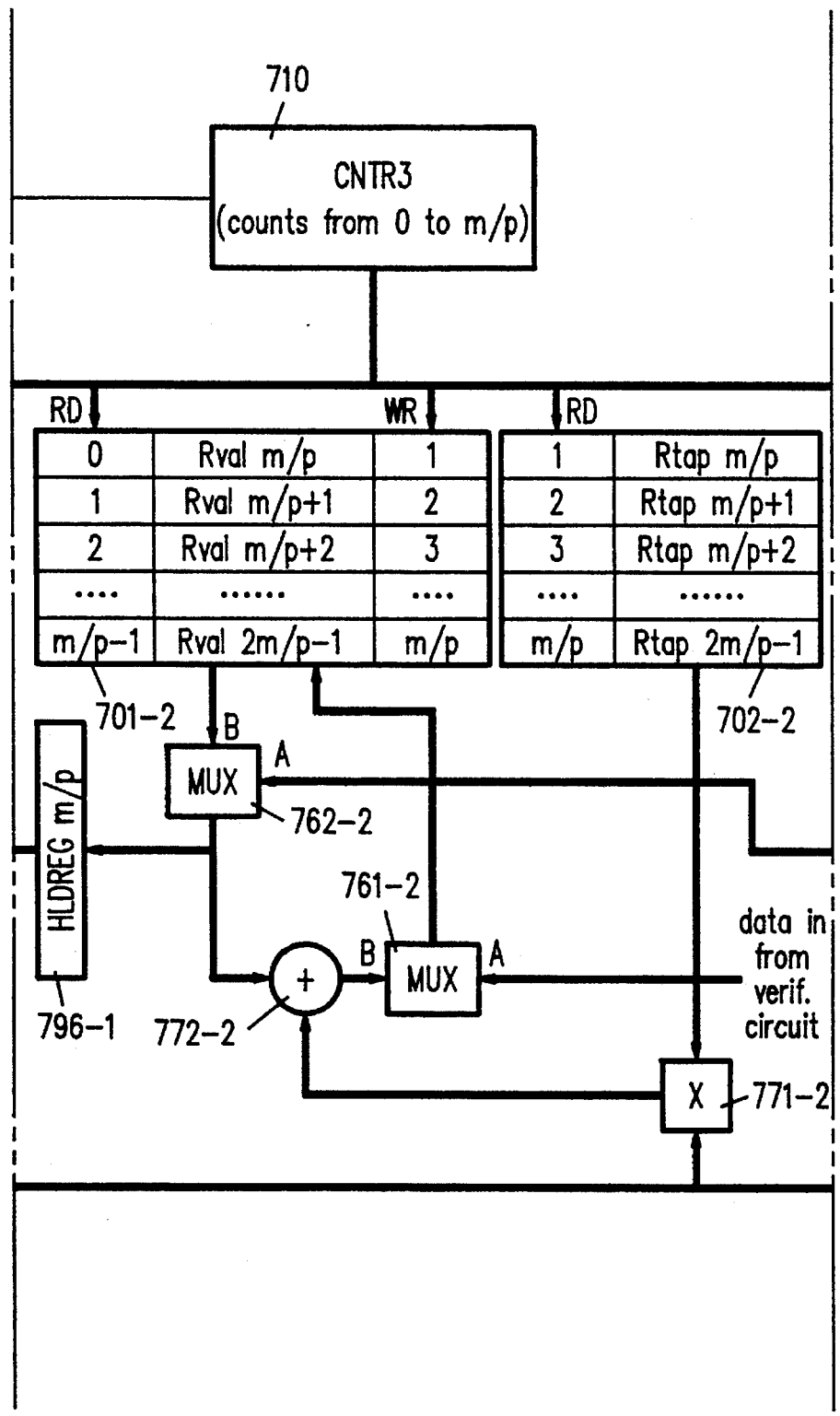

FIG. 7 is a block diagram of one embodiment of a Reed-Solomon ECC single burst error trapper 700 constructed in accordance with the teachings of this invention which utilizes a plurality of parallel processing paths. The operation of the embodiment of FIG. 7 is described with reference to Table 4, for an example where M=12 and P=3.

TABLE 4

| Cntr 3 | Read | Write |
|---|---|---|
| 0 | Rval0 | RFDBHLD = Rval0 |
|   | Rval4 | HLDREG4 = Rval4 |
|   | Rval8 | HLDREG8 = Rval8 |
| 1 | Rval1, Rtap0 | Rval0 = Rval1 xor RFBHLD = Rtapo |
|   | Rval5, Rtap4 | Rval4 = Rval5 xor RFBHLD = Rtap4 |
|   | Rval9, Rtap8 | Rval8 = Rval9 xor RFBHLD = Rtap8 |

TABLE 4-continued

| Cntr 3 | Read | Write |
|---|---|---|
| 2 | Rval2, Rtap1 | Rval1 = Rval2 xor RFBHLD = Rtap1 |
|   | Rval6, Rtap5 | Rval5 = Rval6 xor RFBHLD = Rtap5 |
|   | Rval10, Rtap9 | Rval9 = Rval10 xor RFBHLD = Rtap9 |
| 3 | Rval3, Rtap2 | Rval2 = Rval3 xor RFBHLD = Rtap2 |
|   | Rval7, Rtap6 | Rval6 = Rval7 xor RFBHLD = Rtap6 |
|   | Rval11, Rtap10 | Rval10 = Rval11 xor RFBHLD = Rtap7 |
| 4 | HLDREG4, Rtap3 | Rval3 = HLDREG4 xor RFBHLD = Rtap3 |
|   | HLDREG8, Rtap7 | Rval7 = HLDREG8 xor RFBHLD = Rtap7 |
|   | Rtap11 | Rval11 = RFBHLD = Rtap11 |

Figure 1:
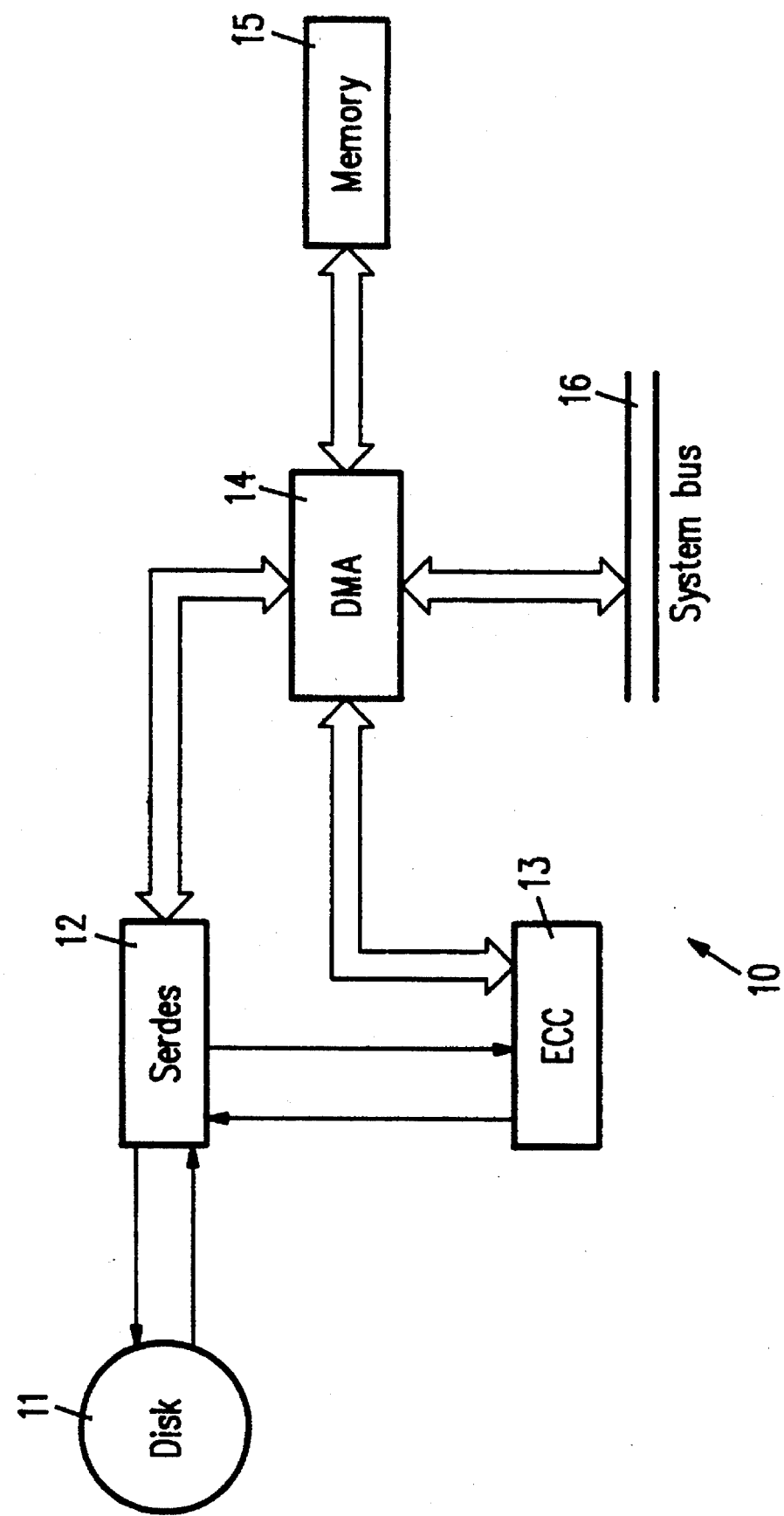
FIG. 1 is a block diagram depicting a typical computer system utilizing error correction code circuitry.

The embodiment shown in FIG. 7 includes a plurality of similar parallel processing paths which work in parallel in order to speed up processing times so that the single burst trapping operation is performed in no more than one half of a sector time, allowing sufficient time for a DMA operation to take place which will correct the error in the data stored in memory 15 (FIG. 1). Each of the P parallel processing paths of the embodiment of FIG. 7 includes an associated one of random access memory (RAM) 701-1 through 701-P, a multiplier 771-1 through 771-P, and an exclusive OR gate array 772-1 through 772-P. RAMs 701-1 through 701-P store a set of values Rval0 through Rval(M-1), divided equally or unequally among the plurality of memory 701-1 through 701-P to provide a plurality of P parallel processing paths of either the same depth or different depths, as desired. Hold register 796-1 through 796-(P-1) store the initial value of a least significant value stored in their associated RAMs 701-2 through 701-P, which are used to calculate the next value of the most significant value stored in preceding RAMs 701-1 through 701-(P-1). Multiplexors 762- through 762-(P-1) serve to select the appropriate value from either associated RAM 701-1 through 701-(P-1) or associated hold register 796-1 through 796-(P-1) for application to the associated one of the plurality of exclusive OR gate arrays 772-1 through 772-(P-1). Tap weight values are stored in memories 702-1 through 702-P.

In operation, an N•M bit syndrome word is output from an ECC generation and detection circuit, such as that shown in the embodiment of FIG. 6, to multiplexors 761-1 through 761-P. When this syndrome word is received, multiplexors 761-1 through 761-P select the syndrome word for application to RAMs 701-1 through 701-P, where the syndrome word is stored in N bit symbols.

To initiate operation of this embodiment of ECC single burst trapping circuit 700, the least significant values stored in RAMs 701-2 through 701-P are accessed and stored in registers 796-1 through 796-(P-1), respectively. The least significant value of RAM 701-1 is stored in RFDHLD register 731.

The next most significant values are read from RAMs 701-1 through 701-P, and tap weight values associated therewith are read from memories 702-1 through 702-P. These tap weight values are applied to multipliers 771-1 through 771-P, which multiply these tap weight values by the value stored in feedback hold register 731. The result of these multiplication operations are provided to exclusive OR gate arrays 772-1 through 772-P for an exclusive OR operation with currently read values from RAMs 701-1 through 701-P. The result of these exclusive OR operations are provided via multiplexors 761-1 through 761-P for storage in RAM 701-1 through 701-P thereby updating these values.

This operation continues up to but not including the final values to be written back to RAMs 701-1 through 701-P. For the final values (i.e. the most significant values) written to RAMS 701-1 through 701-(P-1), the respective hold register values 796-1 through 796-(P-1) are selected via multiplexors 762-1 through 762-(P-1) and exclusive OR'd via Xor gates 761-1 through 761-(P-1), with the multiplication results of the most significant tap weights of ROMS 702-1 through 702-(P-1) and RFBHLD register 736. The result of this exclusive OR operation is written to the values of RAMs 701-1 through 701-(P-1). For RAM 701-P, the most significant tap weight is read from ROM 702-P and multiplied by multiplier 771-P by the value of RFBHLD register 731 and written directly to the most significant value of RAM 701-P by forcing XOR gate 772-P to flow through.

Thus, in accordance with the teachings of this invention, novel ECC circuit and single burst air trapper circuits are taught which reduce integrated circuit die area required for implementation and which are capable of operating at higher speeds than prior art circuits. The use of memories, rather than shift registers, allow a reduction in the number of multipliers, to either a single shared multiplier, or to a single multiplier for each of a plurality of P parallel paths.

The invention now being fully described, it will be apparent to one of ordinary skill in the art that many changes and modifications can be made thereto without departing from the spirit or scope of the appended claims.

What is claimed is:

1. An ECC circuit for analyzing an I bit data sequence having data words of N bit width, comprising:

a first bus for providing a first data word of N bit width;

a first addressable memory device having M addressable locations where M is greater than 1, each of N bit width, for storing information pertaining to an N bit portion of said I bit data sequence, said first addressable memory device including address and bi-directional data lines for reading and writing said information;

a second addressable memory device having M addressable locations, each of N bit width, for storing M tap weight values, said second addressable memory device including address and data lines for reading said tap weight values;

a logic device for logically combining a first and a second logical combination input value and providing a logical combination output value;

a register;

a multiplier for multiplying a first and a second multiplicand and provide a product; and a controller for:
reading a first location of said first memory device to provide a first logical combination input value to said logic device, said first data word serving as said second logical input value to said logic device, and storing said logical combination output value in said register;

sequentially reading successive locations of said first memory device and said second memory device to serve as said first logical combination input value and said second multiplicand, respectively, with said value stored in said register serving as said first multiplicand, and with said product serving as said second logical combination input value, said logical combination output value being written to the previously read location of said first memory device; and reading a last location of said second memory device to provide said second multiplicand, with said value stored in said register serving as said first multiplicand, and writing said product to the previously read location of said first memory device.

2. A circuit as in claim 1 wherein said first bus comprises an output bus of a deserializer circuit which in turn comprises:

a serial input port for receiving a serial bit stream of I bits; and a parallel output port coupled to said first bus, for providing a subset of N bits of said I bit serial bit stream.

3. A circuit as in claim 1 which further comprises circuitry for reading M×N bits from said first addressable memory device upon completion of circuit operation, said M×N bits serving as ECC bits associated with said I bit data stream.

4. A circuit as in claim 3 which further comprises a serializer/deserializer circuit which in turn comprises:

a serial input port for receiving a serial bit stream of I bits;

a parallel output port coupled to said first bus, for providing a subset of N bits of said I bit serial bit stream;

a parallel input port for receiving a plurality of bits in parallel from said first addressable memory device; and a serial output port for providing said I bit data stream and M×N ECC bits from said first addressable memory device, in serial form.

5. A circuit as in claim 1 which further comprises a multiplexor for selecting said data word of N bits or the result of said multiplication operation for application to said logic device.

6. A circuit as in claim 1 wherein said logic device comprises an exclusive OR gate array.

7. An ECC circuit for analyzing an I bit data sequence having M data words of N bit width, comprising:

a first bus for providing a data word of N bit width;

a plurality of P first addressable memories, each having a plurality of locations for a total of M such locations, each of N bit width, said each of said P first addressable memories for storing information pertaining to an N bit portion of said I bit data sequence, each of said P first addressable memories including address and bi-directional data lines for reading and writing said information;

a plurality of P second addressable memories for storing a total of M tap weight values, each of said second addressable memories including address and data lines for reading said tap weight values; and a plurality of P processing paths, each comprising:
a logic device for logically combining a first and a second logical combination input value and providing a logical combination output value;
a register;
a multiplier for multiplying a first and a second multiplicand and provide a product; and a controller for:
reading a first location of one of said first memories to provide a first logical combination input value to said logic device, said first data word serving as said second logical input value to said logic device, and storing said logical combination output value in said register;

sequentially reading successive locations of said one of said first addressable memories and associated second addressable memories to serve as said first logical combination input value and said second multiplicand, respectively, with said value stored in said register serving as said first multiplicand, and with said product serving as said second logical combination input value, said logical combination output value being written to the previously read location of said one of said first addressable memories; and reading a last location of said associated one of said second addressable memories to provide said second multiplicand, with said value stored in said register serving as said first multiplicand, and writing said product to the previously read location of said one of said first addressable memory device.

8. A circuit as in claim 7 wherein said first bus comprises an output bus of a deserializer circuit which in turn comprises:

a serial input port for receiving a serial bit stream of I bits; and a parallel output port coupled to said first bus, for providing a subset of N bits of said I bit serial bit stream.

9. A circuit as in claim 7 which further comprises circuitry for reading a plurality of M×N bits from said first memories upon completion of circuit operation, said M×N bits serving as ECC bits associated with said I bit data stream.

10. A circuit as in claim 9 which further comprises a serializer/deserializer circuit which in turn comprises:

a serial input port for receiving a serial bit stream of I bits;

a parallel output port coupled to said first bus, for providing a subset of N bits of said I bit serial bit stream;

a parallel input port for receiving a plurality of bits in parallel from each of said P first addressable memories; and a serial output port for providing said I bit data stream and M×N ECC bits from said first addressable memories, in serial form.

11. A circuit as in claim 7 wherein each of said processing paths further comprises a multiplexor for selecting said data word of N bits or the result of said multiplication operation for application to said logic device.

12. A circuit as in claim 7 wherein said logic device comprises an exclusive OR gate array.

13. A circuit as in claim 7 which further comprises circuitry allowing a selected value from a first one of said processing paths to be transferred to a second one of said processing paths.

14. A burst error trapper circuit for correcting an I bit data sequence utilizing an ECC word, comprising:

a first addressable memory device having M addressable locations where M is greater than 1, each of N bit width, for storing information pertaining to said ECC word, said first addressable memory device including address and bi-directional data lines for reading and writing said information;

a second addressable memory device having M addressable locations, each of N bit width, for storing M tap weight values, said second addressable memory device including address and data lines for reading said tap weight values;

a logic device for logically combining a first and a second logical combination input value and providing a logical combination output value;

a register;

a multiplier for multiplying a first and a second multiplicand and provide a product; a controller for:

reading a first location of said first addressable memory device and storing said value in said register;

sequentially reading successive locations of said first addressable memory device and said second addressable memory device to serve as said first logical combination input value and said second multiplicand, respectively, with said value stored in said register serving as said first multiplicand, and with said product serving as said second logical combination input value, said logical combination output value being written to the previously read location of said first memory device; and reading a last location of said second addressable memory device to provide said second multiplicand, with said value stored in said register serving as said first multiplicand, and writing said product to the previously read location of said first addressable memory device;

circuitry for determining when said burst error trapper circuit has determined the location of an error; and a first bus for providing correction information as a result of said determination of the location of an error.

15. A circuit as in claim 14 which further comprises a multiplexor for selecting data from an error verification circuit or the result of said logical operation for storage in said first memory.

16. A circuit as in claim 14 wherein said logic device comprises an exclusive OR gate array.

17. A burst error trapper circuit for correcting an I bit data sequence utilizing an ECC word, comprising:

a plurality of P first addressable memories, each having a plurality of locations for a total of M such locations, each of N bit width, for storing information pertaining to an N bit portion of said ECC word;

a plurality of P second addressable memories for storing a total of M tap weight values; and a plurality of P processing paths, each comprising:

a logic device for logically combining a first and a second logical combination input value and providing a logical combination output value;

a register;

a multiplier for multiplying a first and a second multiplicand and provide a product;

a controller for:

reading a first location of one of said first addressable memories and storing said value in said register;

sequentially reading successive locations of one of said first addressable memories and associated one of said second addressable memories to serve as said first logical combination input value and said second multiplicand, respectively, with said value stored in said register serving as said first multiplicand, and with said product serving as said second logical combination input value, said logical combination output value being written to the previously read location of said one of said first addressable memories; and reading a last location of said associated one of said second addressable memories to provide said second multiplicand, with said value stored in said register serving as said first multiplicand, and writing said product to the previously read location of said one of said first addressable memories;

circuitry for determining when said burst error trapper circuit has determined the location of an error; and a first bus for providing correction information as a result of said determination of the location of an error.

18. A circuit as in claim 17 wherein each of said processing paths further comprises a multiplexor for selecting said data word of N bits or the result of another one of said processing paths for application to said logic device.

19. A circuit as in claim 17 wherein said logic device comprises an exclusive OR gate array.

20. A method for operating an ECC circuit for analyzing an I bit data sequence, comprising the steps of:

providing on a first bus a data word of N bit width;

storing within M locations of a first addressable memory device, each location being of N bit width, information pertaining to an N bit portion of said I bit data sequence;

storing within a second addressable memory device a plurality of M tap weight values;

providing a logic device for logically combining a first and a second logical combination input value and providing a logical combination output value;

providing a register;

providing a multiplier for multiplying a first and a second multiplicand and provide a product; and reading a first location of said first memory device to provide a first logical combination input value to said logic device, said first data word serving as said second logical input value to said logic device, and storing said logical combination output value in said register;

sequentially reading successive locations of said first memory device and said second memory device to serve as said first logical combination input value and said second multiplicand, respectively, with said value stored in said register serving as said first multiplicand, and with said product serving as said second logical combination input value, said logical combination output value being written to the previously read location of said first memory device; and reading a last location of said second memory device to provide said second multiplicand, with said value stored in said register serving as said first multiplicand, and writing said product to the previously read location of said first memory device.

21. A method as in claim 20 wherein said step of providing on said first bus comprises the step of operating a deserializer circuit to receive on a serial input port a serial bit stream of I bits, and providing on a parallel output port coupled to said first bus, a subset of N bits of said I bit serial bit stream.

22. A method as in claim 20 which further comprises the step of reading M×N bits from said first addressable memory upon completion of operation, said M×N bits serving as ECC bits associated with said I bit data stream.

23. A method as in claim 20 wherein said step of reading comprises the step of operating a serializer circuit to receive on a parallel input port a plurality of bits in parallel from said first addressable memory, and providing on a serial output port said I bit data stream and M×N ECC bits from said first addressable memory, in serial form.

24. A method as in claim 20 which further comprises the step of selecting said data word of N bits or the result of said multiplication operation for use in said step of logically combining.

25. A method as in claim 20 wherein said step of logically combining comprises the step of performing an exclusive OR operation.

26. A method for operating an ECC circuit for analyzing an I bit data sequence, comprising the steps of:

providing on a first bus a data word of N bit width;

storing within a plurality of M locations of P first addressable memories, each having a plurality of locations for a total of M such locations, each of N bit width, information pertaining to an N bit portion of said I bit data sequence;

storing within P second addressable memories a total of M tap weight values; and operating each of P processing paths, utilizing the steps of:

providing a logic device for logically combining a first and a second logical combination input value and providing a logical combination output value;

providing a register;

providing a multiplier for multiplying a first and a second multiplicand and providing a product;

reading a first location of one of said first memories to provide a first logical combination input value to said logic device, said first data word serving as said second logical input value to said logic device, and storing said logical combination output value in said register;

sequentially reading successive locations of said one of said first addressable memories and associated second addressable memories to serve as said first logical combination input value and said second multiplicand, respectively, with said value stored in said register serving as said first multiplicand, and with said product serving as said second logical combination input value, said logical combination output value being written to the previously read location of said one of said first addressable memories; and reading a last location of said associated one of said second addressable memories to provide said second multiplicand, with said value stored in said register serving as said first multiplicand, and writing said product to the previously read location of said one of said first addressable memory device.

27. A circuit as in claim 26 wherein said step of providing on said first bus comprises the step of operating a deserializer circuit to receive on a serial input port a serial bit stream of I bits, and providing on a parallel output port coupled to said first bus a subset of N bits of said I bit serial bit stream.

28. A method as in claim 26 which further comprises the step of reading M×N bits from said first addressable memories upon completion of operation, said M×N bits serving as ECC bits associated with said I bit data stream.

29. A method as in claim 28 wherein said step of reading comprises the step of operating a serializer circuit to receive on a parallel input port a plurality of bits in parallel from said first addressable memories, and providing on a serial output port said I bit data stream and M×N ECC bits from said first addressable memories, in serial form.

30. A method as in claim 26 wherein said step of operating each of said processing paths further comprises the step of selecting said data word of N bits or the result of said multiplication operation for use in said step of logically combining.

31. A method as in claim 26 wherein said step of logically combining comprises the step of performing an exclusive OR operation.

32. A method as in claim 26 which further comprises the step of allowing a selected value from a first one of said processing paths to be transferred to a second one of said processing paths.

33. A method for operating a burst error trapper circuit for correcting an I bit data sequence utilizing an ECC word, comprising the steps of:

storing in a first addressable memory having M locations, each of N bit width, ECC information pertaining to said ECC word;

storing in a second addressable memory M tap weight values;

providing a logical device for logically combining a first and a second logical combination input value with and providing a logical combination output value;

providing a register;

providing a multiplier for multiplying a first and a second multiplicand and provide a product;

reading a first location of said first addressable memory device and storing said value in said register;

sequentially reading successive locations of said first addressable memory device and said second addressable memory device to serve as said first logical combination input value and said second multiplicand, respectively, with said value stored in said register serving as said first multiplicand, and with said product serving as said second logical combination input value, said logical combination output value being written to the previously read location of said first memory device; and reading a last location of said second addressable memory device to provide said second multiplicand, with said value stored in said register serving as said first multiplicand, and writing said product to the previously read location of said first addressable memory device;

determining when said burst error trapper circuit has determined the location of an error; and providing on a first bus correction information as a result of said determination of the location of an error.

34. A method as in claim 33 which further comprises the step of selecting data from an error verification circuit or the result of said logical operation for storage in said first memory.

35. A method as in claim 33 wherein said step of logically combining comprises the step of performing an exclusive OR operation.

36. A method for operating a burst error trapper circuit for correcting an I bit data sequence utilizing an ECC word, comprising the steps of:

storing within a plurality of locations of P first addressable memories, each having a plurality of locations for a total of M such locations, each of N bit width, information pertaining to an N bit portion of said ECC word;

storing within P second addressable memories a total of M tap weight values; and operating each of P processing paths, utilizing the steps of:

providing a logic device for logically combining a first and a second logical combination input value and providing a logical combination output value;

providing a register;

providing a multiplier for multiplying a first and a second multiplicand and provide a product;

reading a first location of one of said first addressable memories and storing said value in said register;

sequentially reading successive locations of one of said first addressable memories and associated one of said second addressable memories to serve as said first logical combination input value and said second multiplicand, respectively, with said value stored in said register serving as said first multiplicand, and with said product serving as said second logical combination input value, said logical combination output value being written to the previously read location of said one of said first addressable memories; and reading a last location of said associated one of said second addressable memories to provide said second multiplicand, with said value stored in said register serving as said first multiplicand, and writing said product to the previously read location of said one of said first addressable memories;

determining when said burst error trapper circuit has determined the location of an error; and providing on a first bus correction information as a result of said determination of the location of an error.

37. A method as in claim 36 wherein said step of operating each of said processing paths further comprises the step of selecting said data word of N bits or the result of another one of said processing paths for use in said step of logically combining.

38. A method as in claim 36 wherein said step of logically combining comprises the step of performing an exclusive OR operation.

* * * * *